(12) United States Patent
Chang et al.

(10) Patent No.: US 6,368,912 B1
(45) Date of Patent: Apr. 9, 2002

(54) METHOD OF FABRICATING AN ISOLATION STRUCTURE BETWEEN A VERTICAL TRANSISTOR AND A DEEP TRENCH CAPACITOR

(75) Inventors: Chi-Han Chang, Taipei; Tzu-En He, Yilan; Hsin-Chuan Tsai, Taoyuan; Pei-Ing Lee, Changhua, all of (TW)

(73) Assignee: Nanya Technology Corporation (TW)

( * ) Notice: Subject to any disclaimer, the term of this patent is extended or adjusted under 35 U.S.C. 154(b) by 0 days.

(21) Appl. No.: 09/733,888

(22) Filed: Dec. 8, 2000

(51) Int. Cl.⁷ ............... H01L 31/8242; H01L 21/20
(52) U.S. Cl. ............... 438/248; 438/386; 438/391; 438/242; 438/243
(58) Field of Search ............... 438/392, 386, 438/391, 242, 243, 248, 270, 294

(56) References Cited

U.S. PATENT DOCUMENTS

| | | | |
|---|---|---|---|
| 6,063,657 A | * 5/2000 | Bronner et al. | 438/243 |
| 6,074,909 A | * 6/2000 | Gruening | 257/301 |
| 6,291,298 B1 | * 9/2001 | Williams et al. | 257/330 |

* cited by examiner

*Primary Examiner*—Richard Elms
*Assistant Examiner*—Adam Pyonin
(74) *Attorney, Agent, or Firm*—Baker Botts LLP

(57) ABSTRACT

A method of fabricating a horizontal isolation structure between a deep trench capacitor and a vertical transistor thereon is provided. A deep trench capacitor is in the bottom of a deep trench of a substrate. An insulating layer is formed to partially fill the deep trench and also on the substrate by high-density plasma chemical vapor deposition. The insulating layer on the sidewall of the deep trench and on the substrate is removed to transform the insulating layer in the deep trench to an isolation structure. An alternative approach is to form an insulating layer on the substrate and in the deep trench. Then a CMP is performed to remove the insulating layer on the substrate and an etching back is performed to remove the upper portion of the insulating layer in the deep trench. Then the remained insulating layer in the deep trench is served as an isolation structure between the deep trench capacitor and a vertical transistor thereron. The upper portion of the insulating layer in the alternative approach is also can be replaced by a low-cost sacrificial layer.

19 Claims, 8 Drawing Sheets

METHOD OF FABRICATING AN ISOLATION STRUCTURE BETWEEN A VERTICAL TRANSISTOR AND A DEEP TRENCH CAPACITOR

BACKGROUND OF THE INVENTION

1. Field of Invention

The present invention relates to a method for fabricating semiconductor memory devices including random dynamic access memory (DRAM) devices. More particularly, the present invention relates to a method of fabricating an isolation structure between a vertical transistor and a deep trench capacitor.

2. Description of Related Art

As semiconductor integration continuously increases, device dimensions are necessarily accordingly decreased. Hence the conventional scaling techniques are limited by the stringent leakage requirement of devices. For a conventional DRAM cell, although the capacitor has been designed in 3 dimensions, the transistor is still designed in 2 dimensions. Therefore the integration of DRAM cell array is limited.

Grurning et al. proposed a sub-8F2 DRAM cell composing of a deep trench capacitor and a vertical transistor both in a deep trench can largely increase the integration of DRAM cells (A Novel Trench DRAM Cell with a VERtical Access Transistor and BuriEd Strap (VERI BEST) for 4 Gb/16 Gb, p25, 1999 IEDM). In sub-8F2 DRAM cell, the horizontal trench top oxide in the deep trench serves as an isolation structure between the deep trench capacitor and the vertical transistor. In general, a vertical insulating layer in a trench can be formed like a spacer, but a horizontal insulating layer in a deep trench is difficult to form.

SUMMARY OF THE INVENTION

The invention provides a method of fabricating a horizontal isolation structure between a vertical transistor and a deep trench capacitor.

A first embodiment of this invention comprises the following steps. A substrate having a deep trench therein and in turn a pad oxide layer and a silicon nitride layer thereon is provided, wherein the deep trench has a deep trench capacitor on the bottom and an upper sidewall portion of the deep trench is exposed. An insulating layer is formed on the substrate and partially fills the deep trench by high-density plasma chemical vapor deposition. The thickness of the insulating layer on the sidewall of the deep trench is thinner than the thickness of the insulating layer on the deep trench capacitor and the substrate. The insulating layer on the sidewall of the deep trench and a certain thickness of the insulating layer on the substrate and the deep trench capacitor is removed. The thickness of the residual insulating layer, which serves as an isolation structure, on the deep trench capacitor is about 300 to about 900 Å. A certain thickness of protection layer on the insulating layer is form ed above the deep trench capacitor. The silicon nitride layer is removed by wet etching and thus the insulating layer on the silicon nitride layer is lifted. A doped region, which is on the surface of the substrate, is formed surrounding the deep trench. The pad oxide layer and the protection layer are sequentially removed. A gate oxide layer is formed on the exposed surface of the substrate. Shallow trench isolation is formed in the substrate, and the shallow trench isolation partially overlaps the deep trench. A gate is formed over the horizontal isolation and the gate oxide.

In a second embodiment, wherein the thickness of the insulating layer in the first embodiment is increased. The surface of the insulating layer is higher than the surface of the silicon nitride layer at least by about 8000 to about 10000 Å to facilitate performing chemical mechanical polishing for removing the insulating layer above the surface of the silicon nitride layer. Then the upper portion of the remained insulating layer is etched back to form the isolation structure above the deep trench capacitor.

In a third embodiment, wherein the upper portion of the insulating layer in the second embodiment is replaced by a sacrificial layer. The replacement is based on saving the high production cost of the insulating layer deposited by high-density plasma chemical deposition. The low-cost sacrificial layer is deposited by low-pressure chemical vapor deposition or sub-atmospheric pressure chemical vapor deposition. The sacrificial layer also can be a low-cost spin-on-glass layer.

As embodied and broadly described herein, the invention provides various methods to fabricate a horizontal isolation structure between a deep trench capacitor and a vertical transistor in a deep trench. Hence the integration of DRAM cells can be largely increased by a vertical transistor and a deep trench capacitor configuration.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A–1G are cross-sectional views schematically illustrating a fabrication process for forming an isolation structure between a vertical transistor and a deep trench capacitor according to a first preferred embodiment of the invention. In this embodiment, not only the fabrication process of the isolation structure is described, but also how the fabrication process of the isolation structure is integrated into the subsequent fabrication process of the vertical transistor is shown.

Figure 1A:
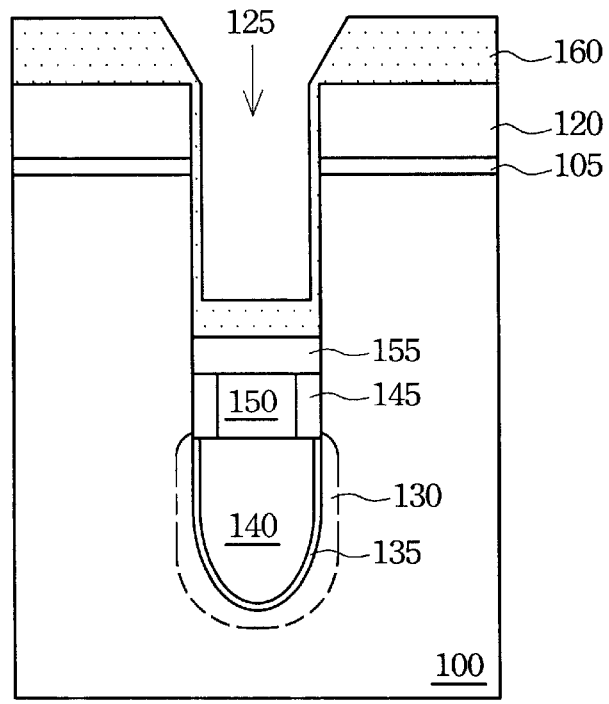
FIGS. 1A–1G are cross-sectional views schematically illustrating a fabrication process for forming an isolation structure between a vertical transistor and a deep trench capacitor according to a first preferred embodiment of the is invention.

In FIG. 1A, a pad oxide layer 105, a silicon nitride layer 120 and a boron-silicon-glass (BSG, not shown in FIG. 1A) are sequentially formed on a substrate 100. The BSG, silicon nitride layer 120 and the pad oxide layer 105 are patterned to serve as an etching mask, then the exposed substrate 100 is etched to form a deep trench 125. The BSG is removed after etching the substrate 100.

The bottom portion of the deep trench 125 is doped to form a doped region 130, and the doped region 130 serves as a lower electrode plate of the deep trench capacitor. A thin dielectric 135 is formed on the surface of the doped region 130, and the thin dielectric 135 serves as a capacitor dielectric. A material of the thin dielectric 135 is, for example, a composite dielectric of silicon nitride/silicon oxide or other suitable dielectrics. A doped polysilicon 140 is formed to partially fill the deep trench 125, and the doped polysilicon 140 serves as an upper electrode plate of the deep trench capacitor.

A collar oxide 145 is formed on the sidewall of the deep trench 125 above the upper electrode to minimize parasitic leakage at the sidewall of the deep trench 125. A doped polysilicon 150 fills the space surrounded by the collar oxide 145, and a doped polysilicon 155 is subsequently formed on the second polysilicon 150 and the collar oxide 145. Both the doped polysilicon 150 and the doped polysilicon 155 serve as a conducting line to electrically connect the deep trench capacitor and a vertical transistor.

An insulating layer 160 is formed on the silicon nitride layer 120, the doped polysilicon 155 and the exposed sidewall of the deep trench 125. The preferred method to form the insulating layer 160 is high-density plasma chemical vapor deposition (HDPCVD). Since the energized ions bombardment during the HDPCVD period, the thickness of the insulating layer 160 on the sidewall of the deep trench 125 is much thinner than the thickness of the insulating layer 160 on the doped polysilicon 155 and the silicon nitride layer 120. Another good reason for depositing the insulating layer 160 by HDPCVD is the good step coverage of HDPCVD. The material of the insulating layer 160 is, for example, silicon oxide.

Figure 1B:
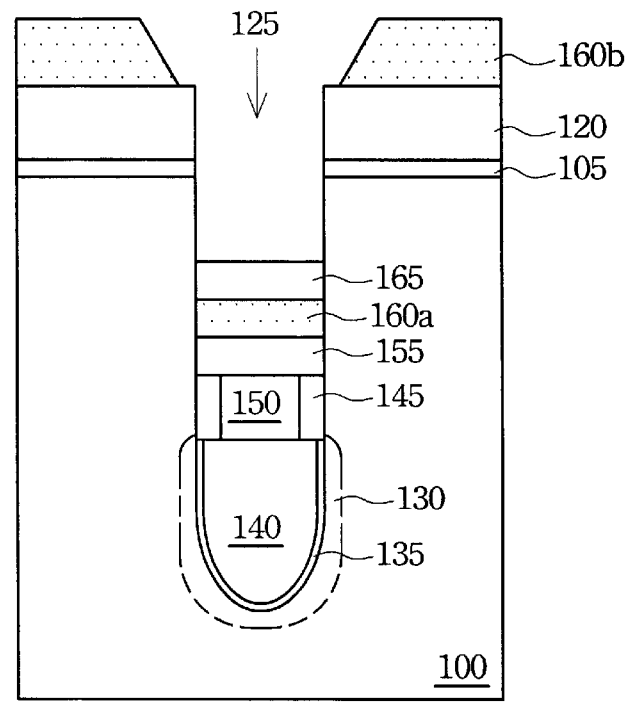

In FIG. 1B, the insulating layer 160 on the sidewall of the deep trench 125 is removed, and a certain thickness of the insulating layer 160 on the silicon nitride layer 120 and on the doped polysilicon 155 is also removed. The preferred removal method of the insulating layer 160 is wet etching, and the etchant used is, for example, HF solution when the material of the insulating layer is silicon oxide. Therefore, the insulating layer 160 transforms to an insulating layer 160a on the doped polysilicon 155 and an insulating layer 160b on the silicon nitride layer 120. The residual thickness of the insulating layer 160a is preferred to be about 300 to about 900 Å, and the insulating layer 160a serves as an isolation structure between the deep trench capacitor and a vertical transistor that is subsequently formed.

A protection layer 165 such as a photoresist layer is formed on the insulating layer 160a to protect the insulating layer 160a in the subsequent steps. When the protection layer 165 is a photoresist layer, the formation method comprises the following steps. For example, a photoresist layer is spin coated on the substrate 100, then an etching back step is performed to remove the photoresist layer outside of the deep trench 125 to leave the photoresist layer, i.e. the protection layer 165, on the insulating layer 160a.

Figure 1C:
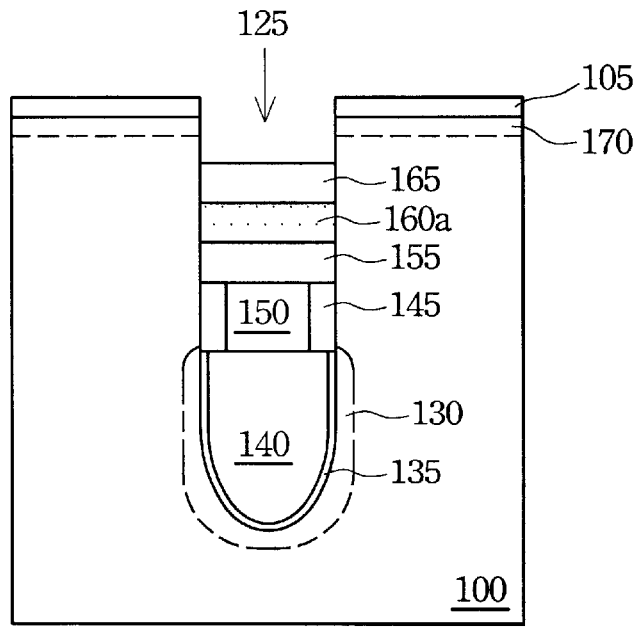

In FIG. 1C, the silicon nitride layer 120 is removed. Therefore, the insulating layer 160b on the silicon nitride layer 120 is lifted in the same step, too. An ion-implanting step is performed to implant ions into the substrate 100, and a doped region 170 is formed surround the deep trench 125. Wherein the removal method of the silicon nitride layer 120 is, for example, wet etching, and the hot phosphoric acid is preferred to be the etchant for its good removal selectivity of the silicon nitride.

Figure 1D:
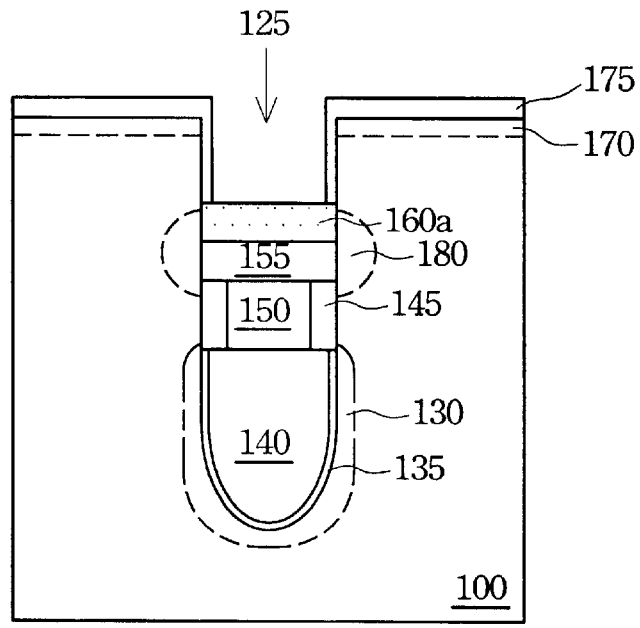
Figure 1:
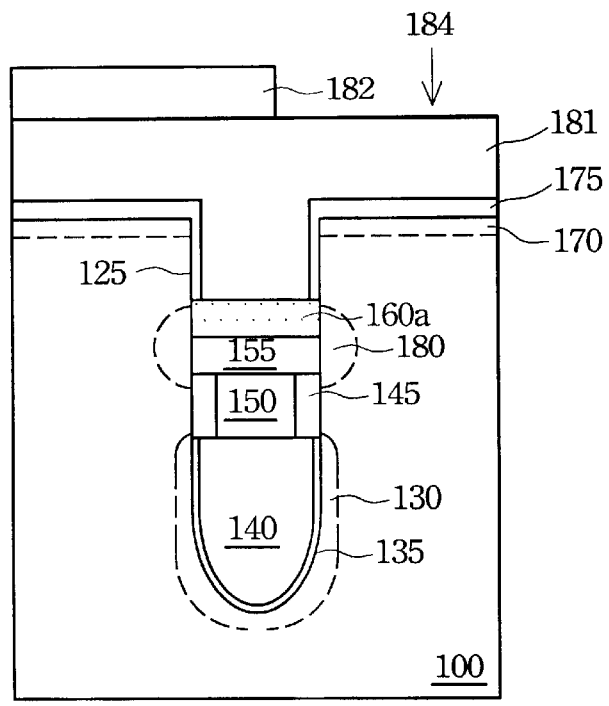
Figure 1:
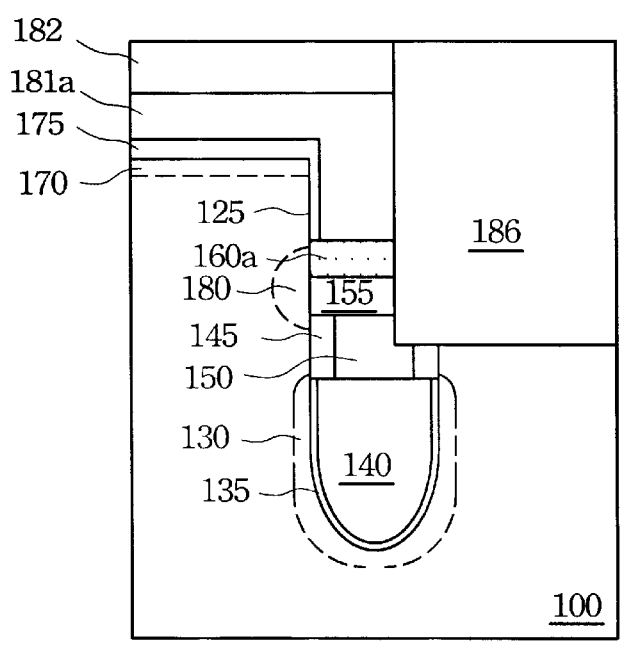

In FIG. 1D, the pad oxide layer 105 is removed by, for example, wet etching, and the preferred etchant is HF solution. The protection layer 165 is removed by, for example, oxygen plasma ashing followed by wet cleaning when the protection layer 165 is a photoresist layer. A thermal oxidation step is performed to form a gate oxide layer 175 on the exposed surface of the substrate 100. During the period of the thermal oxidation, the ions implanted in the doped region 170 is diffused and activated, and the dopants in the doped polysilicon 155 is diffused to the substrate 100 to form a doped region 180 adjacent to the doped polysilicon 155. Both the doped region 170 and the doped region 180 serve as source/drain of the vertical transistor.

In FIG. 1E, a doped polysilicon layer 181 is formed on the substrate 100. A silicon nitride layer 182 is formed, and an opening 184 is formed therein to expose the surface of the doped polysilicon layer 181. The opening 184 partially overlaps the deep trench 125 and typically surrounds an active area where at least a transistor is formed thereon.

In FIG. 1F, the silicon nitride layer 182 serves as an etching mask, and the exposed doped polysilicon layer 181 and the underlying layers are etched to form a trench. After the etching step, the doped polysilicon layer 181 is transformed to a doped polysilicon layer 181a. An insulating material fills the trench to form shallow trench isolation (STI) 186.

Figure 1G:
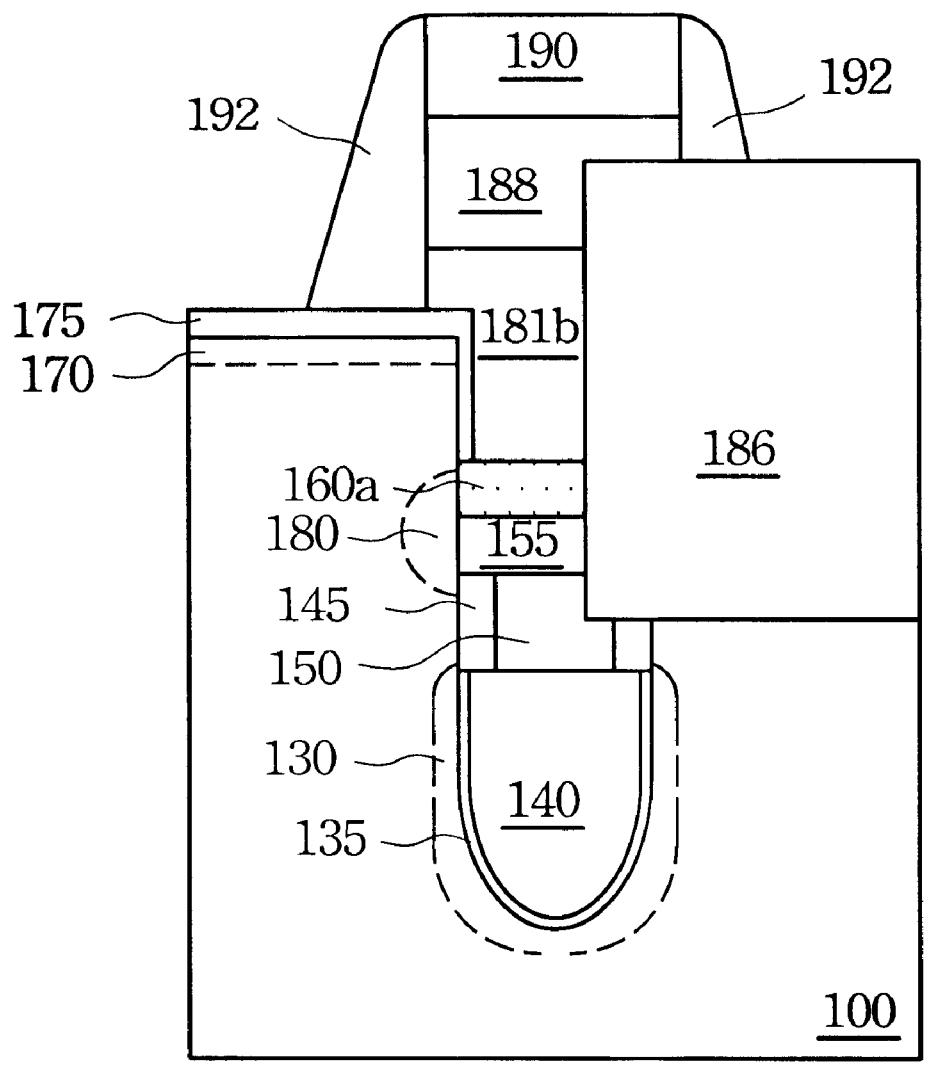

In FIG. 1G, the silicon nitride layer 182 is removed. A silicide layer and a cap layer are sequentially formed on the doped polysilicon layer 181a. The cap layer, the silicide layer and the doped polysilicon layer 181a are patterned to form a gate structure of the vertical transistor. And the cap layer, the silicide layer and the doped polysilicon layer 181a are individually transformed to the cap layer 190, the silicide layer 188 and the doped polysilicon layer 181b. A spacer 192 is formed on the sidewall of the gate structure.

Wherein a material of the silicide layer 188 comprises tungsten silicide, titanium silicide and other suitable metal silicide. A material of the cap layer 190 comprises silicon oxide or silicon nitride. And a material of the spacer 192 comprises silicon oxide or silicon nitride.

In the first embodiment, the HDPCVD is used to deposit the insulating layer 160. The ion bombardment during the sputter deposition provides shadow-free deposition. Consequently, the insulating layer 160 on the sidewall of the deep trench 125 is much thinner than that on the doped polysilicon layer 155 (in FIG. 1A). Hence, the time needed to etch the insulating layer 160 on the sidewall of the deep trench 125 is much shorter than the time needed to etch that on the doped polysilicon layer 155. An isolation structure between a vertical transistor and a deep trench capacitor, i.e. the insulating layer 160a, is left on the doped polysilicon layer 155.

Figure 2A:
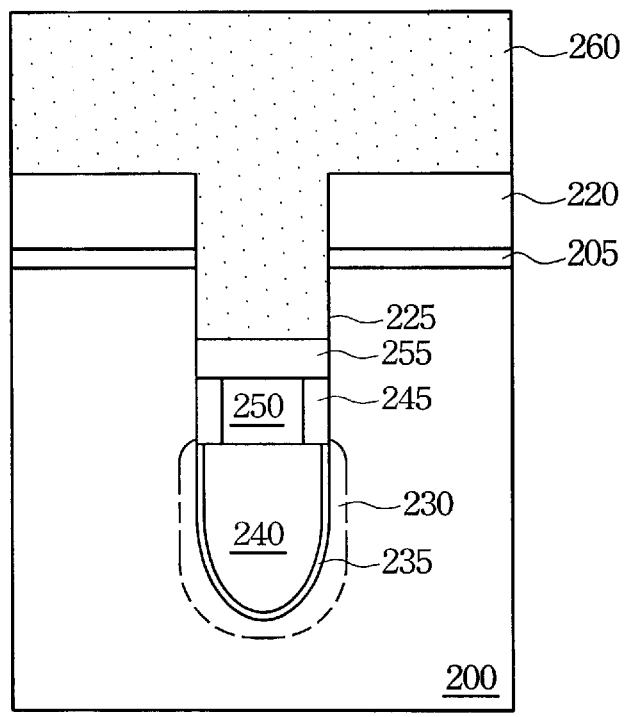
FIGS. 2A–2C are cross-sectional views schematically illustrating a fabrication process for forming an isolation structure between a vertical transistor and a deep trench capacitor according to a second preferred embodiment of the invention.
Figure 2B:
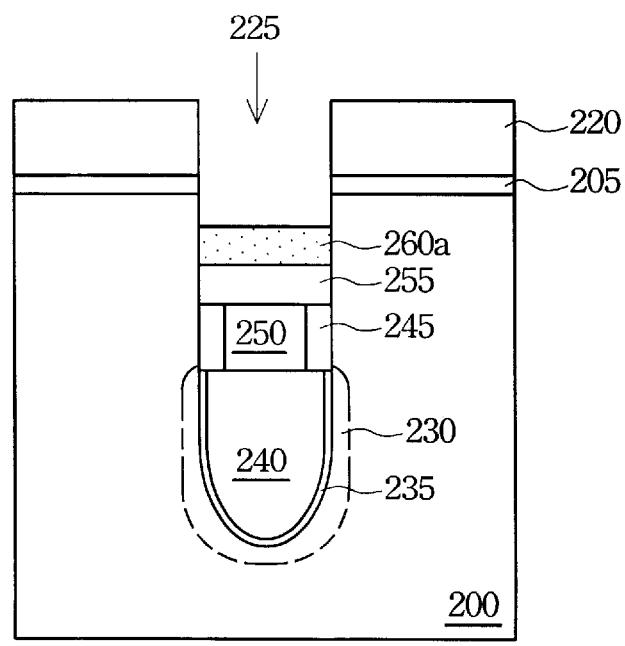
Figure 2C:
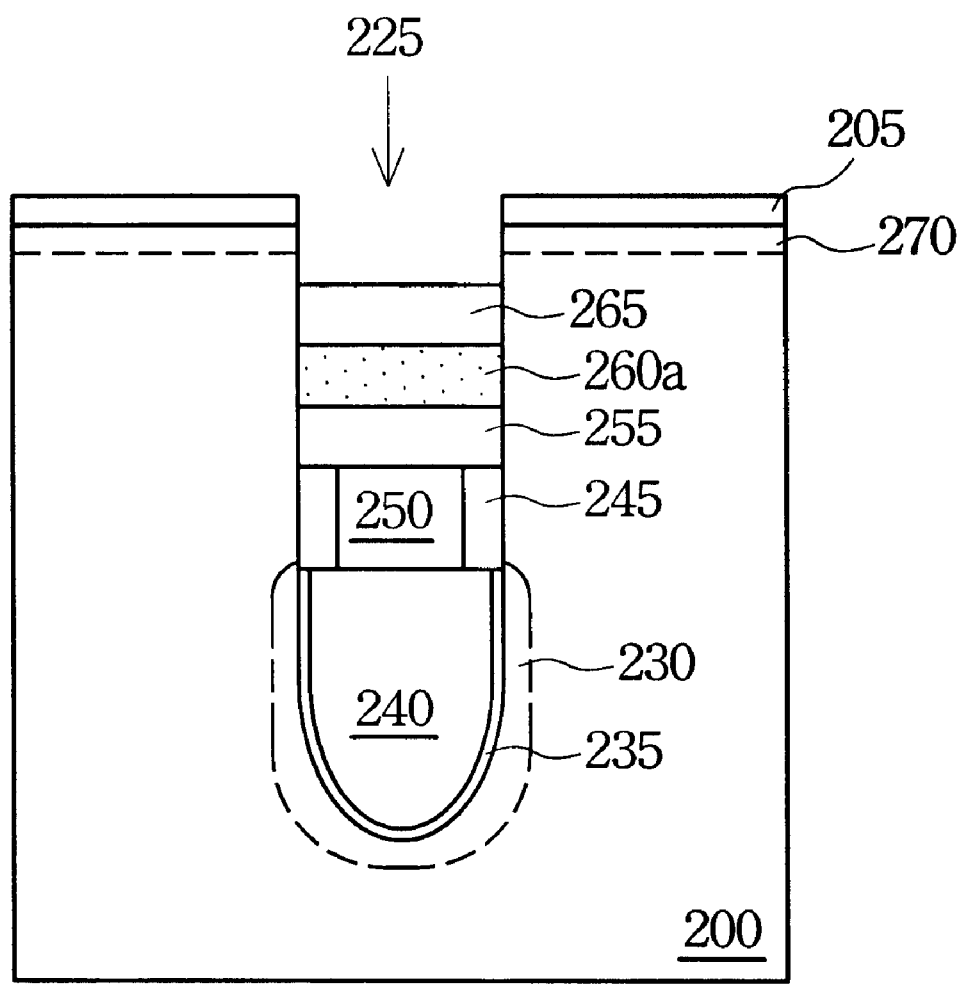

FIGS. 2A–2C are cross-sectional views schematically illustrating a fabrication process for forming an isolation structure between a vertical transistor and a deep trench capacitor according to a second preferred embodiment of the invention. In FIGS. 2A–2C, the marked numbers having the same meaning are 100 larger than those in FIGS. 1A–1G.

In FIG. 2A, the process from forming a pad oxide layer 205 on a substrate 200 to a doped polysilicon layer 255 in the deep trench 225 is as same as the process described in FIG. 1A, thus omitted here. An insulating layer 260 is formed on the silicon nitride layer 220 and in the deep trench 225. The preferred method to form the insulating layer 220 is, for example, HDPCVD for its good step coverage. And the material of the insulating layer 220 is, for example, silicon oxide.

In FIG. 2B, the insulating layer 260 above the silicon nitride layer 220 and an upper portion of that in the deep trench 225 is removed to form an insulating layer 260a. The insulating layer 260a serves as an isolation structure between the deep trench capacitor and a vertical transistor subsequently formed, and the thickness of the insulating layer 260a is preferred to be about 300 to about 900 Å.

For example, the removal process comprises chemical mechanical polishing (CMP) used to remove the insulating layer 260 above the silicon nitride layer 220 and etching back used to remove the upper portion of the insulating layer 260 in the deep trench 225. Therefore, the surface of the insulating layer 260 is preferred to be higher than the surface of the substrate 200 for about at least 8000 to about 10000 Å to facilitate performing CMP. The dry etching such as reactive ion etching (RIE) is preferred for the etching back step.

In FIG. 2C, a protection layer 265 such as a photoresist layer is formed on the insulating layer 260a. The silicon nitride layer 220 is subsequently removed. An ion implanting is performed to form a doped region 270, which serves as source/drain of a vertical transistor subsequently formed.

The following steps for fabricating the vertical transistor are as same as the first embodiment described in FIGS. 1D–1G. Hence those following steps and figures are omitted here. Please referred to the description of FIGS. 1D–1G.

In the second embodiment, the thickness of the insulating layer 260 above the substrate 200 is increased, and two removal steps are subsequently performed to form an isolation structure, the insulating layer 260a, between a deep trench capacitor and a vertical transistor. Therefore, the needed thickness of the insulating layer 260a can be precisely controlled by adjusting parameters of the etching back step.

Figure 3:
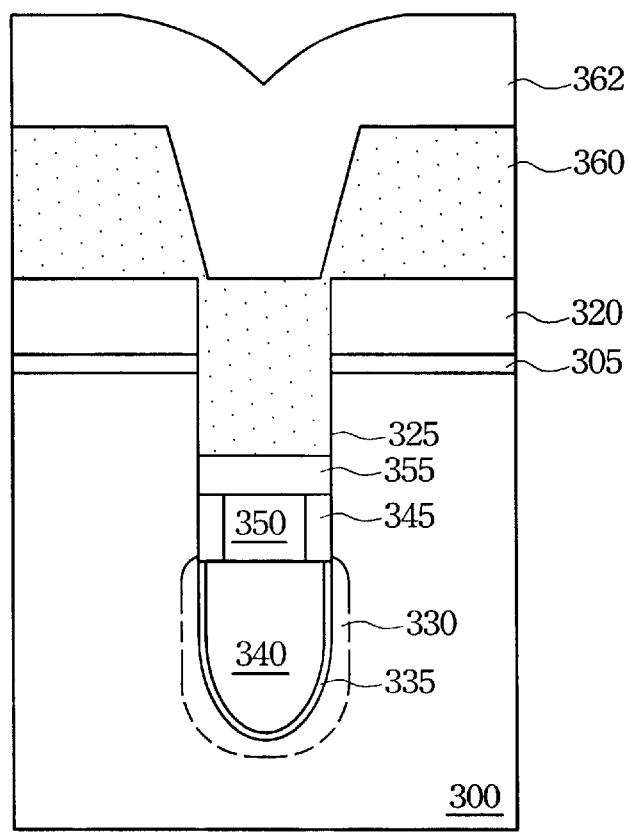
FIGS. 3A–3C are cross-sectional views schematically illustrating a fabrication process for forming an isolation structure between a vertical transistor and a deep trench capacitor according to a third preferred embodiment of the invention.
Figure 3:
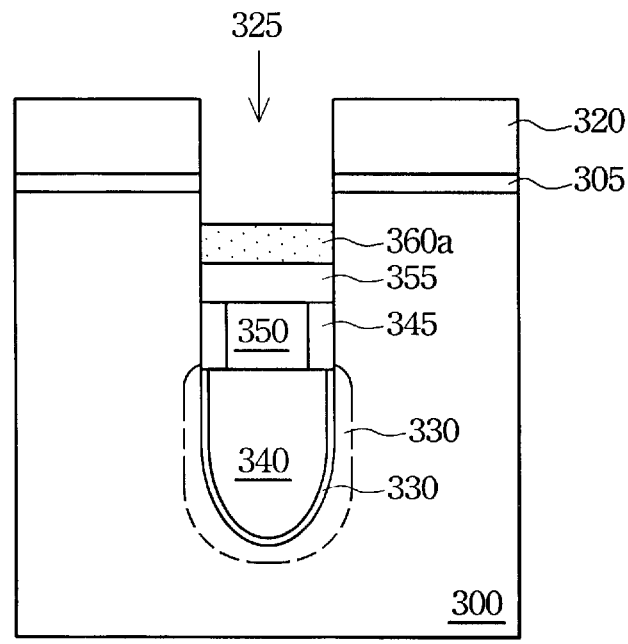
Figure 3C:
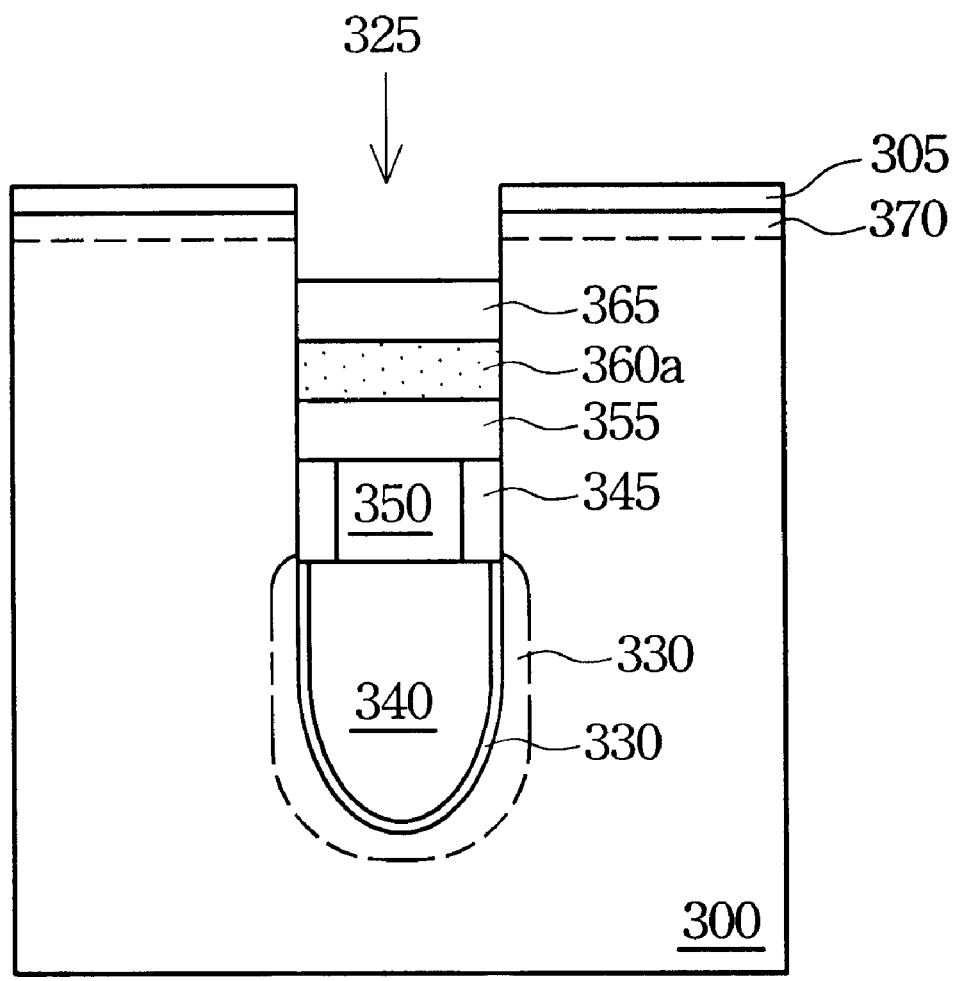

FIGS. 3A–3C are cross-sectional views schematically illustrating a fabrication process for forming an isolation structure between a vertical transistor and a deep trench capacitor according to a third preferred embodiment of the invention. In FIGS. 3A–3C, the marked numbers having the same meaning are 200 larger than those in FIGS. 1A–1G.

In FIG. 3A, the process from forming a pad oxide layer 305 on a substrate 300 to a doped polysilicon layer 355 in a deep trench 325 is as same as the process described in FIG. 1A, hence omitted here. An insulating layer 360 is formed on the silicon nitride layer 320 and in the deep trench 325 and the surface of the insulating layer 360 in the deep trench 325 is about the same level as the surface of the silicon nitride layer 320. The preferred method to form the insulating layer 320 is, for example, HDPCVD for its good step coverage. And the material of the insulating layer 220 is, for example, silicon oxide.

A sacrificial layer 362 is subsequently formed on the insulating layer 360. A material of the sacrificial layer 362 is, for example, silicon oxide deposited by low pressure CVD (LPCVD) or sub-atmospheric pressure CVD (SACVD). The material of the sacrificial layer also can be, for example, spin-on-glass (SOG). The sacrificial layer 362 is used to increase the total thickness of the insulating layer 360 and the sacrificial layer 362 above the substrate 300 to facilitate performing CMP later. The total thickness the insulating layer 360 and the sacrificial layer 362 above the silicon nitride layer 320 is preferred to be about 8000 to about 10000 Å.

In FIG. 3B, CMP is performed to remove the sacrificial layer 362 and the insulating layer 360 above the silicon nitride layer 320. Then etching back is performed to remove the upper portion of the insulating layer 360 in the deep trench 325 to form a insulating layer 360a on the doped polysilicon 355. The thickness of the insulating layer 360a is preferred to be about 300 to about 900 Å.

In FIG. 3C, a protection layer 365 such as a photoresist layer is formed on the insulating layer 360a. The silicon nitride layer 320 is subsequently removed. An ion implanting is performed to form a doped region 370, which serves as source/drain of the vertical transistor subsequently formed.

The following steps for fabricating the vertical transistor are as same as the first embodiment described in FIGS. 1D–1G. Hence those following steps and figures are omitted here. Please referred to the description of FIGS. 1D–1G.

In the third embodiment, the upper portion of the insulating layer 260 in FIG. 2A are replaced by the sacrificial layer 362 in FIG. 3A. The reason for this replacement is caused by the high expense of the HDPCVD. Hence, the cost is lower for the third embodiment than the second embodiment. The total thickness of the insulating layer and the sacrificial layer above the substrate is also increased, and two removal steps are subsequently performed to form the isolation structure, the insulating layer 360a.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a horizontal isolation structure between a vertical transistor and a deep trench capacitor, comprising:

providing a substrate having a pad oxide layer and a silicon nitride layer in turn thereon and a deep trench therein, wherein the deep trench has a deep trench capacitor on the bottom and an upper sidewall portion of the deep trench is exposed;

forming an insulating layer on the substrate and partially filling the deep trench, wherein the thickness of the insulating layer on the sidewall of the deep trench is thinner than that of the insulating layer on the deep trench capacitor and the substrate;

removing the insulating layer on the sidewall of the deep trench to transform the insulating layer into a first insulating layer on the silicon nitride is layer and a second insulating layer on the deep trench capacitor;

forming a protection layer on the second insulating layer;

using wet etching to remove the silicon nitride layer and simultaneously peeling the first insulating layer;

implanting ions into the substrate to form a doped region surrounding the deep trench;

removing the pad oxide layer;

removing the protection layer;

forming a gate oxide layer on the exposed surface of the substrate;

forming a conductive layer on the gate oxide layer and in the deep trench;

forming a shallow trench isolation in the substrate, and the shallow trench isolation partially overlapping the deep trench; and patterning the conductive layer to form a gate over the deep trench.

2. The method as claimed in claim 1, wherein the insulating layer comprises a silicon oxide layer formed by high-density plasma chemical vapor deposition.

3. The method as claimed in claim 1, wherein the protection layer comprises a photoresist layer formed by spin coating.

4. The method as claimed in claim 1, wherein the thickness of the second insulating layer is about 300 to about 900 Å.

5. The method as claimed in claim 1, wherein the method of removing the insulating layer on the sidewall of the deep trench comprises wet etching.

6. The method as claimed in claim 5, wherein the etchant used in the wet etching comprises HF solution when the insulating layer is a silicon oxide layer.

7. A method of fabricating a vertical transistor, comprising:
   providing a substrate sequentially having a pad oxide layer and a silicon nitride layer on the substrate and a deep trench partially filled with a deep trench capacitor, wherein the deep trench has a sidewall;
   forming an insulating layer on the substrate and fill the deep trench, wherein the surface of the insulating layer is higher than the surface of the substrate;
   removing a portion of the insulating layer until the surface of the silicon nitride layer is exposed and an upper portion of the sidewall is exposed to transform the insulating layer in the deep trench to an isolation layer;
   forming a protection layer on the isolation layer;
   removing the silicon nitride layer;
   implanting ions into the substrate to form a doped region around the deep trench;
   removing the pad oxide layer;
   removing the protection layer;
   forming a gate oxide layer on the exposed surface of the substrate;
   forming a conducting layer on the substrate and in the deep trench;
   forming a shallow trench isolation in the substrate, and the shallow trench isolation partially overlapping the deep trench; and
   patterning the conducting layer to form a gate on the deep trench.

8. The method as claimed in claim 7, wherein the surface of the insulating layer is higher then the surface of the substrate by at least about 8000 to about 10000 Å.

9. The method as claimed in claim 7, wherein the insulating layer comprises a silicon oxide layer deposited by high-density plasma chemical vapor deposition.

10. The method as claimed in claim 7, wherein the insulating layer comprises a first silicon oxide layer deposited by high-density plasma chemical vapor deposition and a second silicon oxide layer, and the surface of the first silicon oxide layer in the deep trench is about the same level as the surface of the silicon nitride layer.

11. The method as claimed in claim 10, wherein the method of forming the second silicon oxide layer comprises low pressure chemical vapor deposition.

12. The method as claimed in claim 10, wherein the method of forming the second silicon oxide layer comprises sub-atmospheric pressure chemical vapor deposition.

13. The method as claimed in claim 10, wherein the second silicon oxide layer comprises a spin-on-glass layer.

14. The method as claimed in claim 7, wherein the method of removing the insulating layer comprises:
   removing the insulating layer above the surface of the silicon nitride layer by chemical mechanical polishing; and
   removing an upper portion of the remained insulating layer in the deep trench by dry etching.

15. The method as claimed in claim 7, wherein the thickness of the isolation layer in the deep trench is about 300 to about 900 Å.

16. A method of fabricating an isolation structure between a deep trench capacitor and a vertical transistor, comprising:
   providing a substrate sequentially having a pad oxide layer and a silicon nitride layer thereon and a deep trench partially filled with a deep trench capacitor;
   forming an insulating layer on the substrate and filling the deep trench by high-density plasma chemical vapor deposition, wherein the surface of the insulating layer in the deep trench is about the same level as the surface of the silicon nitride layer;
   forming a sacrificial layer on the insulating layer and the surface of the insulating layer is higher than the surface of the substrate by at least about 8000 to about 10000 Å;
   removing the sacrificial layer and the insulating layer above the silicon nitride layer by chemical mechanical polishing;
   etching back the upper portion of the insulating layer in the deep trench; and
   forming a vertical transistor in the deep trench.

17. The method as claimed in claim 16, wherein the insulating layer comprises a silicon oxide layer.

18. The method as claimed in claim 16, wherein the sacrificial layer comprises a silicon oxide layer deposited by low pressure chemical vapor deposition or sub-atmospheric pressure chemical vapor deposition.

19. The method as claimed in claim 16, wherein the sacrificial layer comprises a spin-on-glass layer.

* * * * *